(12) United States Patent
Zhang

(10) Patent No.: US 6,469,361 B2
(45) Date of Patent: *Oct. 22, 2002

(54) SEMICONDUCTOR WAFER

(75) Inventor: Nan Zhang, Eden Prairie, MN (US)

(73) Assignee: ADC Telecommunications, Inc., Eden Prairie, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 09/946,390

(22) Filed: Sep. 4, 2001

(65) Prior Publication Data

US 2002/0009863 A1 Jan. 24, 2002

Related U.S. Application Data

(62) Division of application No. 09/372,428, filed on Aug. 11, 1999, now Pat. No. 6,316,282.

(51) Int. Cl.[7] .............................................. H01L 29/00
(52) U.S. Cl. ....................... 257/507; 257/510; 257/513; 438/48; 438/50
(58) Field of Search ................. 257/510, 500, 257/512, 513; 438/48, 50, 52, 103, 128, 221, 296, 353, 421, 739

(56) References Cited

U.S. PATENT DOCUMENTS

| | | |
|---|---|---|
| 5,018,812 A | 5/1991 | Fukuda |
| 5,110,760 A | 5/1992 | Hsu |
| 5,148,506 A | 9/1992 | McDonald |
| 5,155,778 A | 10/1992 | Magel et al. |
| 5,199,088 A | 3/1993 | Magel |
| 5,232,866 A | 8/1993 | Beyer et al. |
| 5,239,599 A | 8/1993 | Harman |
| 5,345,521 A | 9/1994 | McDonald et al. |
| 5,403,673 A | 4/1995 | Haga et al. |
| 5,420,067 A | 5/1995 | Hsu |

(List continued on next page.)

FOREIGN PATENT DOCUMENTS

| | | |
|---|---|---|
| EP | 0 607 680 A2 | 7/1994 |
| JP | 62144161 | 6/1987 |
| JP | 01270227 | 10/1989 |
| JP | 03154214 | 2/1991 |
| WO | WO 96/08036 | 3/1996 |
| WO | WO 99/36948 | 7/1999 |
| WO | WO 99/50863 | 10/1999 |

OTHER PUBLICATIONS

Article entitled "Vertical Mirrors Fabricated by Reactive Ion Ecthing for Fiber Optical Switching Application" by Marxer et al., 6 pages.
Article entitled "Microactuated Micro–XYZ Stages for Free–Space Micro–Optical Bench," by Lin et al, 6 pages.
Document entitled "Folded Beam Structures in Polysilicon Resonators," printed from internet site www.aad.berkeley.edu, Jan. 25, 1999, 3 pages.
Document entitled "'Total MEMS Solutions™', Advanced MicroMachines Incorporated," printed from internet site www.memslink.com, Apr. 26, 1999, 2 pages.

(List continued on next page.)

Primary Examiner—David Nelms
Assistant Examiner—Dung Anh Le
(74) Attorney, Agent, or Firm—Merchant & Gould P.C.

(57) ABSTRACT

Techniques for etching a wafer layer using multiple layers of the same photoresistant material and structures formed using such techniques are provided. In a method, first, multiple layers of the same photoresist material are formed over the wafer layer to form a composite photoresist layer. The composite photoresist layer is patterned and developed to form a patterned photoresist layer. Exposed portions of the wafer layer are then removed using the pattern photoresist layer. Each of the multiple layers of photoresist may, for example, be formed to a maximum rated thickness for the photoresist material. Structures formed using this process may have relatively small dimensions (e.g., widths of 5 microns or less or a spacing or pitch of 5 microns or less). In addition, structures may also have sidewalls which are relatively long, smooth, and/or vertical.

5 Claims, 3 Drawing Sheets

U.S. PATENT DOCUMENTS

| | | | |
|---|---|---|---|
| 5,578,975 | A | 11/1996 | Kazama et al. |
| 5,594,818 | A | 1/1997 | Murphy |
| 5,594,820 | A | 1/1997 | Garel-Jones et al. |
| 5,616,514 | A | 4/1997 | Muchow et al. |
| 5,618,383 | A | 4/1997 | Randall |
| 5,623,564 | A | 4/1997 | Presby |
| 5,623,568 | A | 4/1997 | Khan et al. |
| 5,627,924 | A | 5/1997 | Jin et al. |
| 5,629,993 | A | 5/1997 | Smiley |
| 5,646,095 | A | 7/1997 | Eidelloth et al. |
| 5,661,591 | A | 8/1997 | Lin et al. |
| 5,684,631 | A | 11/1997 | Greywall |
| 5,706,123 | A | 1/1998 | Miller et al. |
| 5,750,420 | A | 5/1998 | Bono et al. |
| 5,761,350 | A | 6/1998 | Koh |
| 5,774,604 | A | 6/1998 | McDonald |
| 5,778,513 | A | 7/1998 | Miu et al. |
| 5,790,720 | A | 8/1998 | Marcuse et al. |
| 5,808,780 | A | 9/1998 | McDonald |
| 5,814,554 | A | 9/1998 | De Samber et al. |
| 5,863,839 | A | 1/1999 | Olson et al. |
| 6,229,640 | B1 * | 5/2001 | Zhang ......................... 359/290 |
| 6,242,363 | B1 * | 6/2001 | Zhang ......................... 438/739 |

OTHER PUBLICATIONS

Document entitled "Mems Optical Inc. Micro–Electro–Mechanical Systems," printed from internet site www.memsoptical.com, Oct. 8, 1998, 6 pages.

Document entitled "UW–MEMS Patent Archive," printed from internet site www.mems.engr.wisc.edu, Oct. 8, 1998, 3 pages.

Document entitled "MEMS Fabrication Capabilities in various institutions and organizations," printed from internet site www.mems.isi.edu, Oct. 8, 1998, 5 pages.

Document entitled "Intelligent Cross–Bar Switch for Optical Telecommunications based on Micro–Mirror Array," printed from internet site dewww.eptl.ch, Oct. 8, 1998, 7 pages.

Document entitled "Sandia National Laboratories Intelligent Micromachine Initiative, MEMS Overview," printed from internet sitr www.mdl.sandia.gov, Oct. 8, 1998, 7 pages.

Document entitled "Sandia National Laboratories Intelligent Micromachine Initiative Image Gallery," printed from internet site www.mdl.sandia.gov, Oct. 8, 1998, 8 pages.

Document entitled "Sandia National Laboratories Intelligent Micromachine Initiative Technologies: Integrated Trench Technology," printed from internet site www.mdl.sandia.gov, Oct. 8, 1998, 3 pages.

Document entitled "MEMS (Micro–Electro–Mechanical–System) Project," printed from internet site www.mcc.com, Oct. 8, 1998, 4 pages.

Document entitled "What is MEMS!," printed from internet site www.elvisions.com, Oct. 8, 1998, 1 page.

Document entitled "Statement of Work (Exhibit P) MEMS Project to the Research and Development Agreement Sep. 2, 1998," printed from internet site www.mcc.com, Oct. 8, 1998, 8 pages.

Document entitled "Introduction to Microengineering," printed from internet site www.ee.surrey.ac.uk, Oct. 8, 1998, 13 pages.

* cited by examiner

SEMICONDUCTOR WAFER

This application is a divisional of application Ser. No. 09/372,428, filed Aug. 11, 1999, which application(s) are incorporated herein by reference now U.S. Pat. No. 6,316,282.

FIELD OF THE INVENTION

The present invention generally relates to semiconductor wafers and, more particularly, to methods of etching semiconductor wafers using multiple layers of the same photoresistant material and the resultant structures.

BACKGROUND OF THE INVENTION

Semiconductor technology has driven rapid advancements in many disciplines across numerous industries. Semiconductor technology has facilitated the fabrication of highly complex and compact integrated circuit (IC) devices. Semiconductor technology has also facilitated the manufacture of microelectromechanical systems (MEMS). At present, advancements are being made to facilitate the fabrication of MEMS in integrated circuits on a common substrate.

During the fabrication of the above devices, numerous structures are typically formed on a semiconductor wafer. These structures may, for example, be formed on the semiconductor substrate itself or on another layer formed over the semiconductor substrate. As used herein, the term wafer layer will be used to refer to any layer on a semiconductor wafer, including the substrate itself and overlying layers. The structures may include gate electrodes and trenches, commonly found on integrated circuit devices, and mirrors, gears and comb fingers, commonly found on MEM systems.

Many of the structures found on IC devices and MEM systems are deep and narrow and/or narrowly spaced and can benefit from having smooth and/or vertical sidewalls. Narrow structures allow device sizes to be scaled down. Smooth and vertical sidewalls can for example increase the durability and reliability of a structure. This, in turn, can increase the life span of the structure and can increase fabrication yield. Smooth and vertical side walls can also improve the operating characteristics of a structure. For example, smooth and vertical side walls of a mirror can improve the optical transmission properties of an optical switch. As a result, manufacturers continue to seek techniques for improving the smoothness and/or verticality of narrow and deep structures formed on semiconductor wafers.

SUMMARY OF THE INVENTION

The present invention generally provides techniques for etching a wafer layer using multiple layers of the same photoresistant material and structures formed using such techniques. In one embodiment, a method is provided for removing portions of a wafer layer. First, multiple layers of the same photoresist material are formed over the wafer layer to form a composite photoresist layer. The composite photoresist layer is patterned and developed to form a patterned photoresist layer. Exposed portions of the wafer layer are then removed using the patterned photoresist layer. Each of the multiple layers of photoresist may, for example, be formed to a maximum rated thickness for the photoresist material. Structures formed using this process may have relatively small dimensions (e.g., widths of 5 microns or less or a spacing or pitch of 5 microns or less). In addition, structures may also have sidewalls which are relatively long, smooth, and/or vertical.

The above summary of the present invention is not intended to describe each illustrated embodiment or every implementation of the present invention. The figures in the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
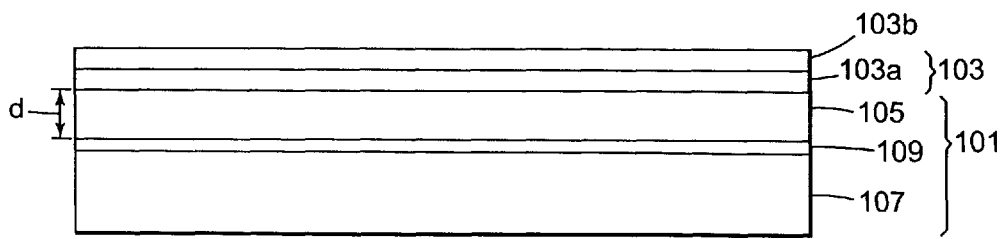
FIGS. 1A–1D and 2 illustrate an exemplary process in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention generally provides techniques for etching semiconductor wafers using photoresist. Aspects of the invention are particularly suited for the formation of relatively deep and narrow MEMS structures. While the present invention is not so limited, a more thorough understanding of the invention may be gained through a reading of the example embodiments discussed below.

FIGS. 1A–1D illustrate one exemplary process for etching a semiconductor wafer using multiple layers of the same photoresist material. In FIG. 1A, a composite photoresist layer 103 is formed over a substrate 101. The exemplary substrate 101 includes an upper wafer layer 105 separated from a lower wafer layer 107 by a buried insulating layer 109. The buried insulating layer 109 may be formed from an oxide, such as silicon dioxide, for example. The use of a silicon-on-insulator (SOI) substrate is particularly suited for MEMS applications. The invention is however not limited to such substrates but extends to cover the etching of structures on other types of substrates or layers formed thereover.

In accordance with the invention, the composite photoresist layer 103 includes two or more layers of the same photoresist material. In the illustrated process, two layers 103a and 103b are shown. The composite layer 103 typically has a thickness which is greater than the maximum rated thickness of a single layer of the photoresist material. In one embodiment, both photoresist layers 103a and 103b are formed to their maximum rated thickness, thereby providing a composite layer 103 having twice the thickness of a single layer of the photoresist material. The maximum rated thickness for a photoresist material a common photoresist property typically provided by a photoresist manufacturer generally corresponds to the greatest thickness at which a layer of the photoresist material may be formed with a planar upper surface.

Each of the photoresist layers 103a and 103b are typically formed and then cured prior to the formation of a subsequent photoresist layer. In the illustrated embodiment, photoresist layer 103a is deposited and then cured (e.g., through heating a wafer) and then the second layer 103b is deposited and the resultant composite layers then heated to cure the second layer 103b. When using more than two photoresist layers, this process may be repeated. The photoresist layers 103a and 103b may be deposited using known techniques, such as spin-on deposition.

The type of photoresist material for the layers 103a and 103b is typically selected in consideration of the desired dimensions of the structure(s) being formed. In the illustrated embodiment, actuator comb fingers having a width of about 3 microns, and spacing (e.g., between fingers 113a, b of opposite combs) of about 2 microns are formed in an upper wafer layer 105 having a depth d of about 75 microns. In this case, a photoresist material such as S1818 provides adequate patternability and protection for the desired features. S1818 photoresist has a maximum rated thickness of about 2 microns.

In one example embodiment, the substrate 101 is spin coated with a first layer 103a of S1818 to about 2 microns. The first layer of S1818 is then cured by subjecting the substrate 101 to a hot plate at 90° C. for 10 seconds. About 2 microns of a second layer 103b of S1818 is then spin coated on to the first layer 103a. The resulting composite photoresist layer is then placed on a hot plate at 90° C. for 90 seconds. Following the hot plate the substrate 101 and composite photoresist layer is then baked in an oven for 10 minutes at 115° C.

Figure 1B:
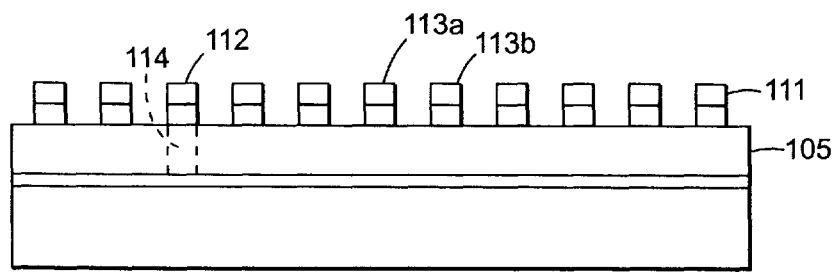
Figure 2:
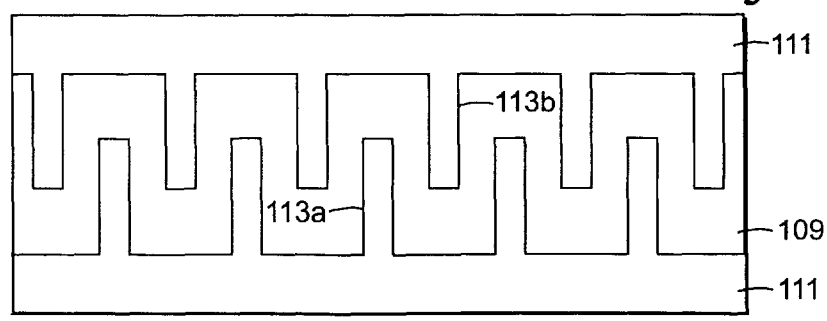

The composite photoresist layer 103 is then patterned to form a patterned photoresist layer 111, as illustrated in FIG. 1B. In the example embodiment, the patterned photoresist layer 111 includes masking portions 112 covering areas 114 of the wafer layer 105 in which comb fingers will be formed. A top view of the semiconductor wafer at this stage is illustrated in FIG. 2. During patterning, portions of the photoresist layer 103 are typically removed to expose regions of the wafer layer 105. When using S1818 photoresist as well as other photoresists, this may advantageously be performed using acetone rather than ultrasound. The use of acetone can, for example, improve the cleanliness (e.g., prevent the formation of debris) and improve the surface roughness of the resultant structure.

Figure 1C:
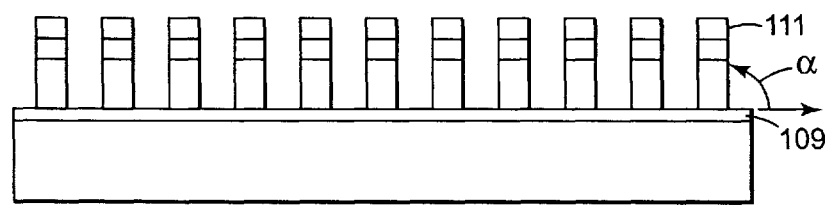
Figure 1D:
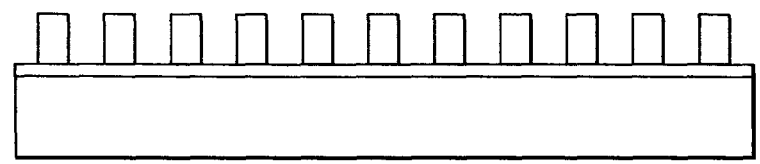

Using the patterned photoresist layer 111 as a mask, exposed portions of the wafer layer 105 may be removed as illustrated in FIG. 1C. This may be performed using, for example, known etching techniques such as deep reactive ion etching (DRIE). In one embodiment, a standard BOSCH DRIE process is used. This process is typically a 3-step process carried out under the following conditions:

Pressure: 15 m Torr

He Flow: 7.45 sccm (standard cubic centimeters per minute)

In step 1, $C_4 F_8$ 200 (70 sccm), $SF_6$ 200 (0.5 sccm) and Argon (40 sccm) are flowed for 4 seconds. In step 2, $C_4 F_8$ 200 (0.5 sccm), $SF_6$ 200 (50 sccm) and Argon (40 sccm) are flowed for 3 seconds. In the step 3, $C_4 F_8$ 200 (0.5 sccm), $SF_6$ 200 (100 sccm) and Argon (40 sccm) are flowed for 5 seconds. In an alternate embodiment, the flow time for the first and second steps are increased (to, e.g., 5 seconds and 4 seconds, respectively) and the flow time for the third step is decreased (to, e.g., 3 seconds). This alternative embodiment advantageously provides more vertical sidewalls than the standard BOSCH DRIE process. Typically, the verticality $\lambda$ ranges from 90°±0.60° or better (e.g., 90°±0.50° 90°±0.40° or 90°±0.3° or better). The patterned photoresist layer 111 may then be removed to leave the structure illustrated in FIG. 1D. Thus photoresist removal may also be performed using acetone rather than ultrasound.

Figure 3:
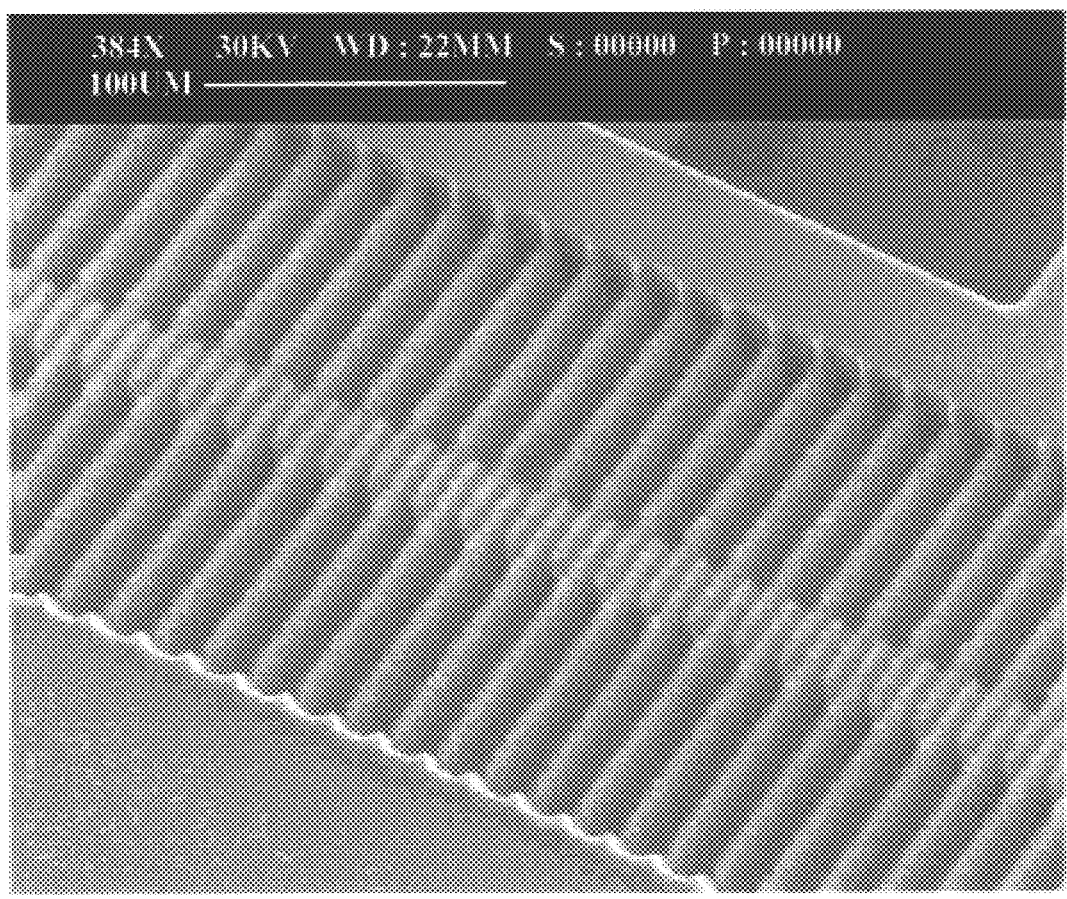
FIG. 3 is a perspective view of actuator combs formed using an oxide mask.
Figure 4:
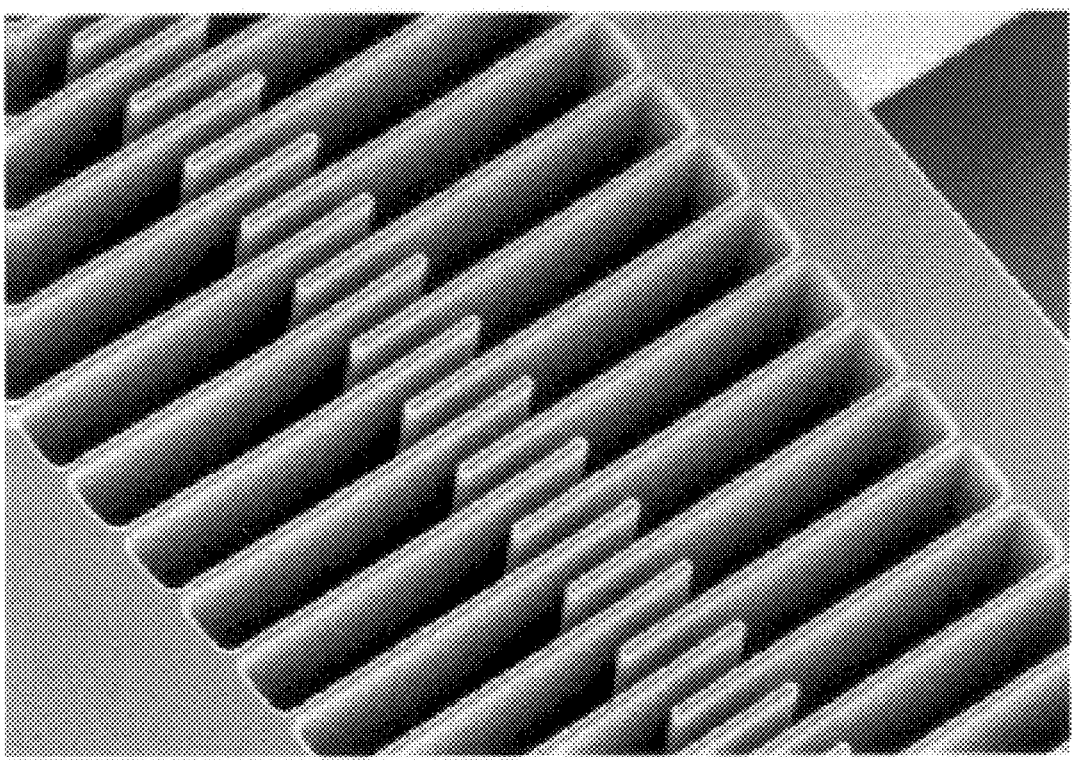
FIG. 4 is a perspective view of actuator combs formed in accordance with an embodiment of the invention.

Using the above process, relatively deep (e.g., 60 microns or more) and narrow and/or narrowly spaced structures (e.g., spacing or width of 5 microns or less) may be formed in a wafer layer. The use of multiple layers of the same photoresist material maintains the resolution of the photoresist material while allowing a deep etch. This provides advantages over the use of a single photoresist layers or oxide masks. For example, a single photoresist layer having greater thickness typically provides less resolution. An oxide mask, while it may provide similar resolution and etch depth, typically is associated with a rougher surface and debris. By way of illustration, FIGS. 3 and 4 show comb fingers formed using the above process and using an oxide mask, respectively. As shown in FIG. 3, the above process provides smoother surfaces. Surfaces having a roughness of 30 nanometers (nm) root mean squared (rms) or less may be formed, even on deep (e.g., >60 microns) and vertical (e.g., 90±0.6° or better) sidewalls.

While the above embodiment illustrates the use of a multiple photoresist layer in forming comb fingers, the invention is not so limited. The above process may be used to form other structures for a MEMS device, such as a vertical mirror or actuator beam walls. A mirror, for example, may include smooth and vertical sidewalls separated from a surrounding trench and may be formed, as discussed in application Ser. No. 09/372,265, entitled "Microelectromechanical Optical Switch and Method of Manufacture Thereof", the contents of which are herein incorporated by reference. The above processing may also may used on structures other than MEMS structures, such as integrated circuit devices. For example, the above process may be applied to the formation of isolation trenches, gate electrodes and so forth in integrated circuit devices, such as MOS devices. Accordingly, as noted above, the term wafer layer includes any layer on a semiconductor wafer, including the substrate itself and overlying layers.

As noted above, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A semiconductor wafer, comprising:
   a wafer layer;
   a vertical structure defined by the wafer layer, the vertical structure including a sidewall having length of 60 microns or more and a surface roughness of 30 nm rms or less.

2. The semiconductor wafer of claim 1, wherein the sidewall has a length of 75 microns or more.

3. The semiconductor wafer of claim 1, wherein the sidewall has a verticality of at least 90±0.6 degrees.

4. The semiconductor device of claim 3, wherein the vertical structure has a width of 5 microns or less.

5. The semiconductor device of claim 3, wherein the vertical structure is spaced from an adjacent structure by 5 microns or less.

* * * * *